(12) United States Patent
Shibagaki et al.

(10) Patent No.: US 8,147,242 B2
(45) Date of Patent: Apr. 3, 2012

(54) SUBSTRATE SUPPORTING/TRANSFERRING TRAY

(75) Inventors: Masami Shibagaki, Fuchu (JP); Yasumi Kurematsu, Fuchu (JP)

(73) Assignee: Canon Anelva Corporation, Kanagawa-Ken (JP)

( * ) Notice: Subject to any disclaimer, the term of this patent is extended or adjusted under 35 U.S.C. 154(b) by 309 days.

(21) Appl. No.: 12/632,161

(22) Filed: Dec. 7, 2009

(65) Prior Publication Data
US 2010/0084392 A1  Apr. 8, 2010

Related U.S. Application Data

(63) Continuation of application No. 11/665,446, filed as application No. PCT/JP2005/019091 on Oct. 18, 2005, now Pat. No. 7,780,440.

(30) Foreign Application Priority Data

Oct. 19, 2004  (JP) .................................. 2004-303875

(51) Int. Cl.
*F27D 5/00* (2006.01)
(52) U.S. Cl. ..................................... 432/253; 219/443.1
(58) Field of Classification Search .................. 432/253, 432/254.1, 258; 211/41.18; 219/443.1
See application file for complete search history.

(56) References Cited

U.S. PATENT DOCUMENTS

| | | | |
|---|---|---|---|
| 4,447,711 A | 5/1984 | Fischer | |
| 4,518,848 A | 5/1985 | Weber | |
| 4,578,031 A | 3/1986 | Johnson et al. | |
| 5,755,570 A * | 5/1998 | Shinde et al. | 432/253 |
| 5,761,023 A | 6/1998 | Lue et al. | |
| 5,791,895 A * | 8/1998 | Kyung et al. | 432/253 |
| 6,001,183 A | 12/1999 | Gurary et al. | |
| 6,280,183 B1 | 8/2001 | Mayur et al. | |

(Continued)

FOREIGN PATENT DOCUMENTS

JP    3-39835 U    4/1991

(Continued)

OTHER PUBLICATIONS

International Search Report of Application No. PCT/JP2005/019091 dated Feb. 7, 2006.

*Primary Examiner* — Gregory A Wilson
(74) *Attorney, Agent, or Firm* — Buchanan Ingersoll & Rooney P.C.

(57) ABSTRACT

To provide a substrate supporting/transferring tray, which can be placed on a substrate supporting part arranged in a treatment chamber in which the heat treatment is performed to a substrate, especially on a substrate supporting part having a built-in heating means for heating the substrate, and on an upper side of which, the substrate is placed. At the time of heat-treating the substrate, the substrate can be more uniformly heated, and when the heat treatment is completed, the tray can be easily removed from the substrate supporting part without waiting for the temperature of the substrate to be reduced, and can transfer the substrate to other parts from the treatment chamber in which the heat treatment is performed. The substrate supporting/transferring tray, which has the disc-shaped substrate supporting part on an upper plane side, and is provided with a cylindrical side wall part extending from a periphery of the disc-shaped substrate supporting part to a lower side, and an annular part extending from a lower end side of the cylindrical side wall part to an outer side in a diameter direction.

7 Claims, 7 Drawing Sheets

U.S. PATENT DOCUMENTS

| | | |
|---|---|---|
| 6,617,751 B2 | 9/2003 | Sunwoo et al. |
| 7,329,947 B2 * | 2/2008 | Adachi et al. ............ 257/706 |
| 7,331,780 B2 | 2/2008 | Adachi |
| 7,780,440 B2 * | 8/2010 | Shibagaki et al. ........... 432/247 |
| 2001/0053507 A1 | 12/2001 | Kuga et al. |
| 2009/0095733 A1 | 4/2009 | Komatsu |

FOREIGN PATENT DOCUMENTS

| | | |
|---|---|---|
| JP | 5-243171 A | 9/1993 |
| JP | 5-326532 A | 12/1993 |
| JP | 9-219440 A | 8/1997 |
| JP | 11-067819 A | 3/1999 |
| JP | 2002-002695 A | 1/2002 |

* cited by examiner

PRIOR ART

SUBSTRATE SUPPORTING/TRANSFERRING TRAY

CROSS-REFERENCE TO RELATED APPLICATIONS

This application is a continuation of U.S. application Ser. No. 11/665,446 filed on Apr. 16, 2007, which is a national stage application of International Application No. PCT/JP2005/019091 filed on Oct. 18, 2005, and which claims priority to Japanese Application No. 2004-303875, filed on Oct. 19, 2004, the entire contents of which are incorporated herein by reference.

TECHNICAL FIELD

The present invention relates to a substrate supporting/transferring tray that is provided so that it can be placed on a substrate supporting member arranged in a treatment chamber where the heat treatment occurs for a semiconductor substrate that is placed on the upper side of the substrate supporting member. More specifically, the present invention also relates to a substrate supporting/transferring tray that can be placed on a substrate supporting member incorporating a heating means therein for heating the substrate that is placed on the upper side of the substrate supporting member.

BACKGROUND

In the semiconductor manufacturing apparatus where the heat treatment occurs for a semiconductor substrate under the vacuum condition or atmospheric condition within the treatment chamber, the heat treatment may occur for the semiconductor substrate as it is placed on the substrate supporting/transferring tray having a substrate supporting part on its upper side, in order to ensure that the semiconductor substrate can be heated uniformly during the heating process or can be transferred to any subsequent process after the heat treatment is completed.

As shown in FIG. 7 (*a*), for example, a semiconductor substrate 1 may be placed on a substrate supporting/transferring tray 18 having a substrate supporting portion on its upper side, and the heat treatment may occur for the substrate 1 under the vacuum condition or atmospheric condition by placing the substrate supporting/transferring tray having the substrate placed thereon onto a substrate supporting member 2 that incorporates a heating means 4 therein for heating the semiconductor substrate.

In the embodiment shown in FIG. 7 (*a*), the substrate supporting/transferring tray 18 is only intended to heat the substrate 1 uniformly. Thus, when one substrate 1 for which the heating process is completed is removed from the treatment chamber (not shown) and another substrate 1 is then transferred into the treatment chamber in which it is subjected to the heating process, it is impossible to use the transfer robot or the like because there is no area on the substrate supporting/transferring tray 18 that can be supported by the transfer robot. The problem is, therefore, that when the heating process is completed for the substrate 1, the substrate 1 cannot be transferred until its temperature is lowered.

In the embodiment shown in FIG. 7 (*b*), the substrate supporting/transferring tray 18*a* has the form of a flat plate having a substrate supporting portion on its upper side, and has its outer peripheral edge 18*d* diametrically larger than the outer peripheral edge 2*a* of a substrate supporting member 2 incorporating a heating means for heating the substrate. This is disclosed in Japanese patent application as published under H2002-2695.

For the substrate supporting/transferring tray 18*a* shown in FIG. 7 (*b*), the transfer robot or the like can be used because the outer peripheral edge 18*d* is diametrically larger than the outer peripheral edge 2*a* of the substrate supporting member 2 that incorporates the heating means 4 for heating the substrate, wherein the transfer robot or the like can be operated for causing a pair of forks bifurcated at the forward end thereof to support the underside (bottom side in FIG. 7 (*b*)) of the outer peripheral edge 18*c* of the substrate supporting/transferring tray 18*a*.

When the heating process is completed for the substrate 1, the substrate supporting/transferring tray 18*a* can be removed from the upper side of the substrate supporting member 2 of the substrate supporting/transferring tray 18*a* by operating the transfer robot to cause the forward ends of its pair of forks to support the underside (bottom side in FIG. 7 (*b*)) of the outer peripheral edge 18*c* of the substrate supporting/transferring tray 18*a*. This can be accomplished without having to wait for the temperature of the substrate 1 to be lowered. Then, another substrate supporting/transferring tray 18*a* that follows the preceding substrate supporting/transferring tray and having a new substrate 1 placed on its substrate supporting portion 2 may be transferred onto the substrate supporting member 2 within the treatment chamber where the heating process may occur for the new substrate 1, in the same manner as described above. This permits the heating process to occur efficiently for more than one substrate in sequence.

In the embodiment shown in FIG. 7 (*b*) in which the substrate supporting/transferring tray 18*a* in the form of the flat plate having its outer peripheral edge 18*d* diametrically larger than the outer peripheral edge 2*a* of the substrate supporting member 2 is placed on the substrate supporting member 2 incorporating the heating means 4 for heating the substrate 1 and the heating process occurs for the substrate 1 being placed on the substrate supporting/transferring tray 18*a*, however, it may be appreciated that heat is radiated from the outer peripheral edge side 18*c* of the substrate supporting/transferring tray 18*a* projecting beyond the outer peripheral edge 2*a* of the substrate supporting member 2. Thus, the temperature difference or non-uniform temperature distribution may occur between the center portion side and outer peripheral edge side 18*c* of the substrate supporting/transferring tray 18*a*, causing the substrate 1 to be heated non-uniformly during the heating process.

OBJECTS AND SUMMARY

One object of the present invention is to provide a substrate supporting/transferring tray having a substrate (semiconductor substrate) placed on its upper side and which may be placed on a substrate supporting member, particularly a substrate supporting member incorporating a heating means therein for heating the substrate that is arranged in the treatment chamber where the heating process occurs for the substrate under the vacuum condition or atmospheric condition, wherein the substrate supporting/transferring tray allows the substrate (semiconductor substrate) to be heated more uniformly during the heating process while at the same time the substrate supporting/transferring tray can easily be removed from the substrate supporting member when the heating process is completed for the substrate, without having to wait until the temperature of the substrate is lowered, and then can be transferred from the treatment chamber into any subsequent process. Thus, the heating process can occur efficiently for more than one substrate in sequence.

In order to attain the above object and solve the problems described above in connection with the prior art, an embodiment of the substrate supporting/transferring tray proposed by the present invention, on the upper side of which a substrate (semiconductor substrate) may be placed, may be placed on the substrate supporting member that is arranged in the treatment chamber in which the heating process occurs for the substrate, wherein the substrate supporting/transferring tray includes a disc-shaped substrate supporting portion located on its upper side, a lateral wall portion that extends downwardly from the peripheral edge of the disc-shaped substrate supporting portion and optimally an annular portion that extends radially outwardly from the bottom end side of the cylindrical lateral wall portion.

Several advantages may be provided by the substrate supporting/transferring tray having a substrate (semiconductor substrate) placed on its upper side and which may be placed on a substrate supporting member, particularly a substrate supporting member incorporating a heating means therein for heating the substrate and which is arranged in the treatment chamber where the heating process occurs for the substrate under the vacuum condition or atmospheric condition, wherein the substrate supporting/transferring tray allows the substrate (semiconductor substrate) to be heated more uniformly during the heating process while at the same time the substrate supporting/transferring tray can easily be removed from the substrate supporting member when the heating process is completed for the substrate, without having to wait until the temperature of the substrate is lowered, and then can be transferred from the treatment chamber into any subsequent process and wherein the heating process can occur efficiently for more than one substrate in sequence.

BRIEF DESCRIPTION OF DRAWINGS

FIG. 6 (*b*) represents a front view illustrating how the substrate supporting/transferring tray having a substrate placed thereon can be operated in accordance with an embodiment of the present invention.

BEST MODE OF EMBODYING THE INVENTION

The following describes several preferred embodiments of the present invention by referring to the accompanying drawings.

Figure 1:
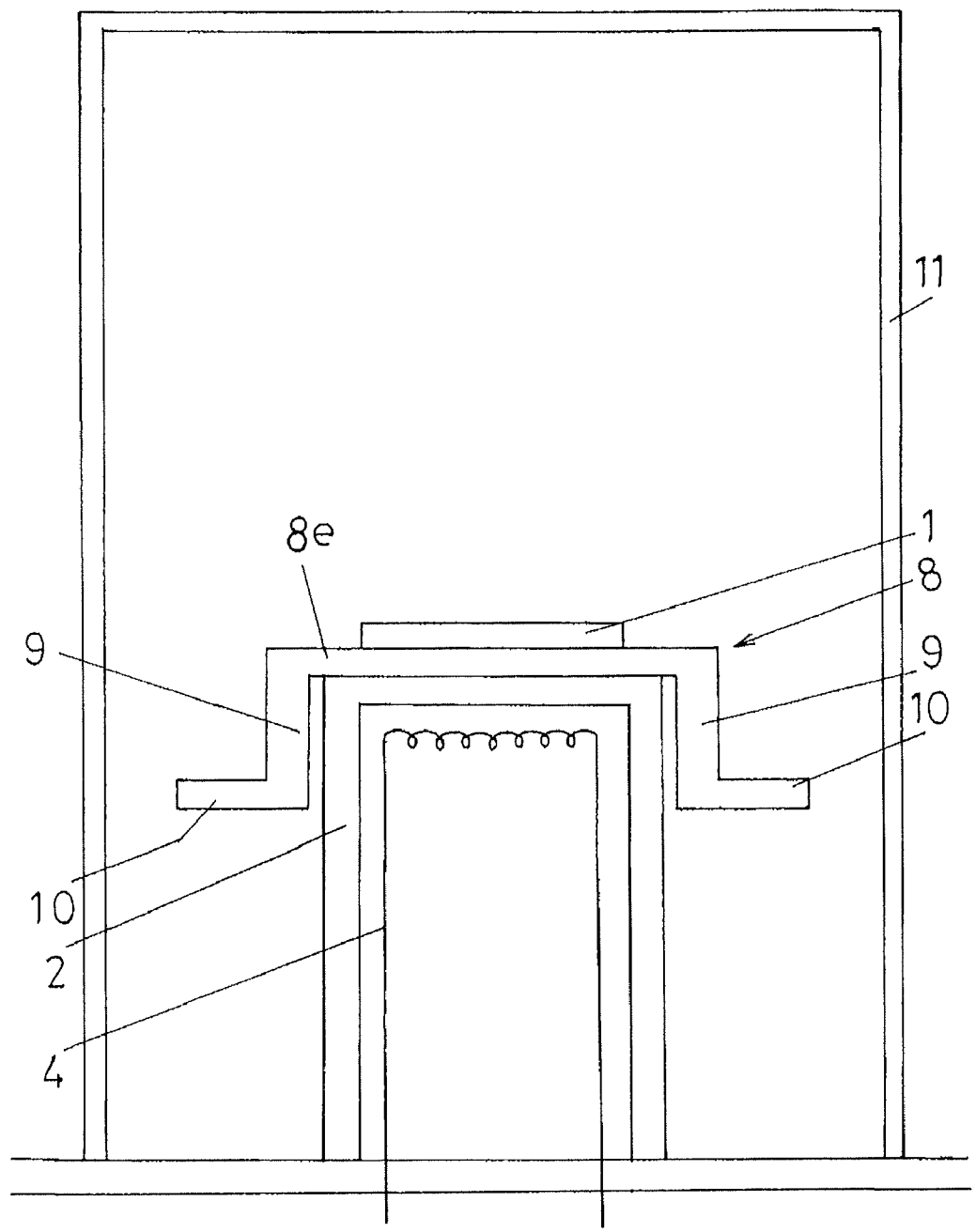
FIG. 1 represents a cross-sectional view illustrating the substrate supporting/transferring tray according to a first embodiment of the present invention although some parts are not shown.

By first referring to FIG. 1, a first embodiment of the present invention is described.

A substrate supporting member 2 is arranged inside a treatment chamber 11 in which heat treatment may be performed for a substrate 1. The substrate supporting member 2 has a heater or heating means 4 incorporated therein for heating the substrate, such as a thermoelectron generator intended for heating by electron impact, an infrared lamp intended for heating by infrared rays and the like. In this way, the substrate 1 may be treated thermally inside the treatment chamber 11.

The treatment chamber 11 in which the heat treatment occurs for the substrate 1 may be placed internally under a specific vacuum condition or under atmospheric condition.

A substrate supporting/transferring tray 8 is now described. The substrate supporting/transferring tray 8 may be placed on the substrate supporting member 2, and a substrate (a semiconductor substrate such as Si substrate, SiC substrate and the like, for example) may be placed on the upper side of the substrate supporting member.

Figure 3:
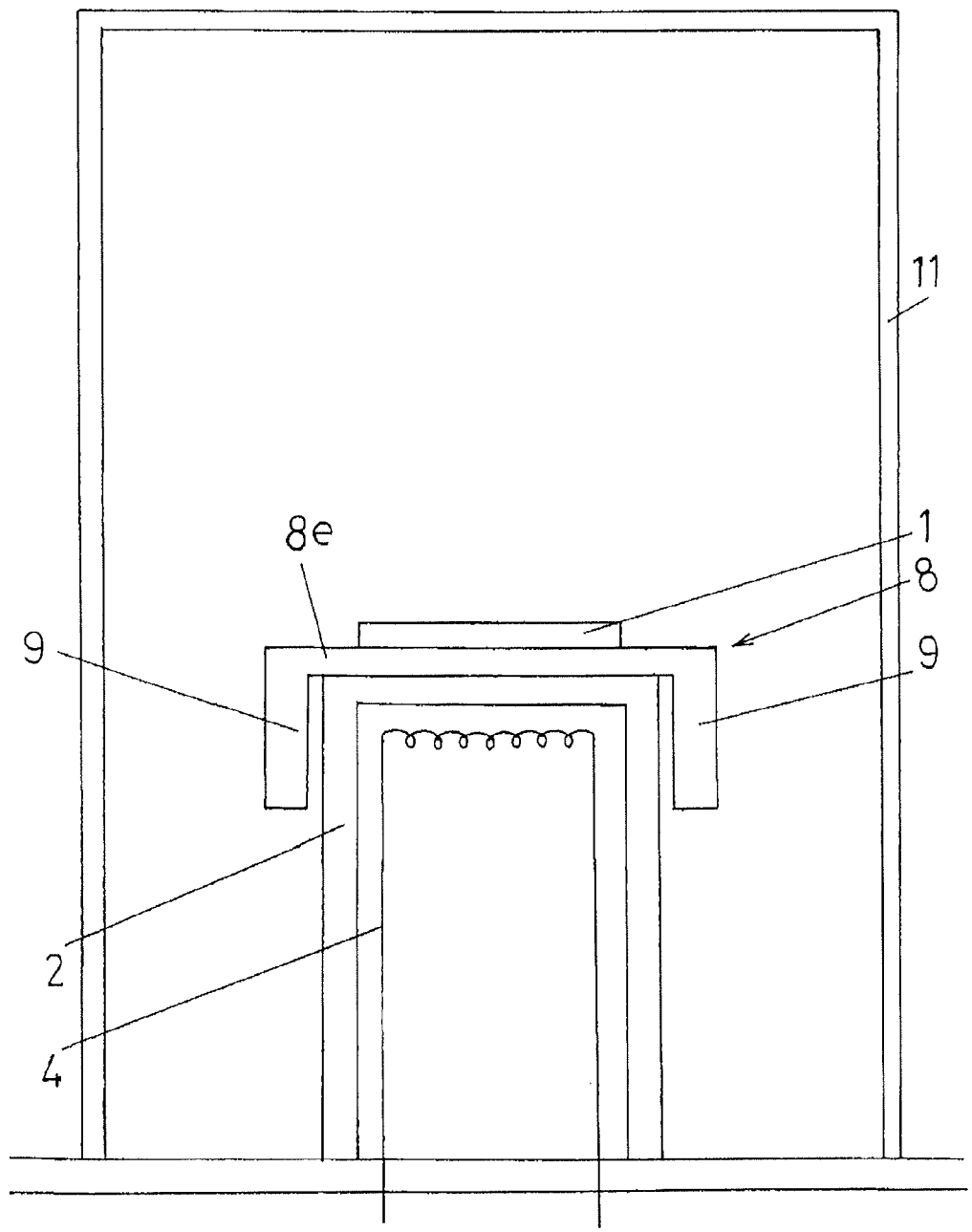
FIG. 3 represents a cross-sectional view illustrating the substrate supporting/transferring tray according to a variation of the first embodiment of the present invention shown in FIG. 1, although some parts are not shown.

The substrate supporting/transferring tray 8 includes a disc-shaped substrate supporting portion 8*e* (FIG. 3 (*a*)) on its upper side, and a cylindrical lateral wall portion 9 that extends from the peripheral edge of the disc-shaped substrate supporting portion 8*e* toward its bottom side.

Figure 2:
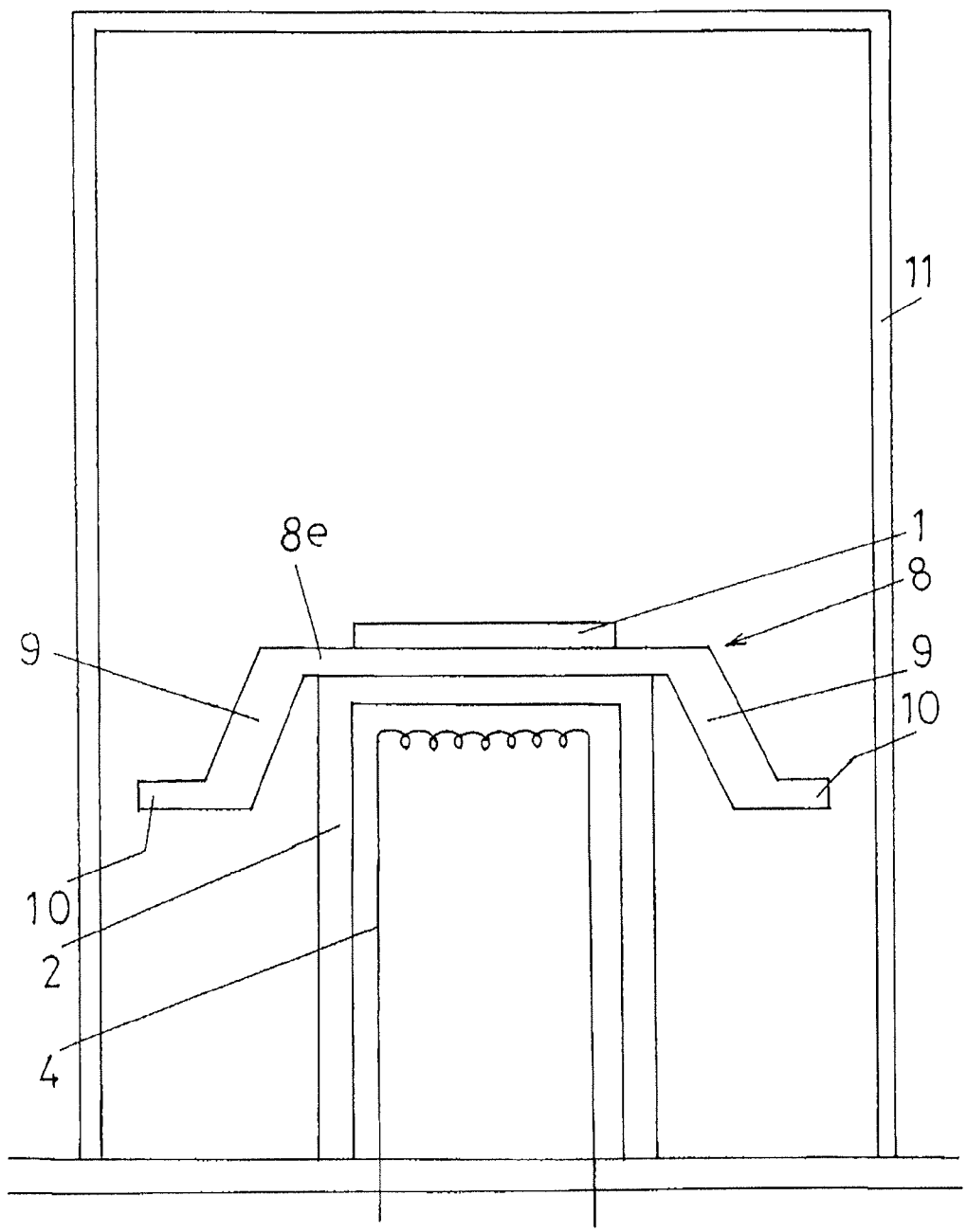
FIG. 2 represents a cross-sectional view illustrating the substrate supporting/transferring tray according to a second embodiment of the present invention although some parts are not shown.

As shown in FIG. 1, the cylindrical lateral wall portion 9 may be formed like a cylindrical shape that extends vertically from the peripheral edge of the disc-shaped substrate supporting portion 8*e* toward the bottom side (bottom end in FIG. 1) along the outer periphery of the cylindrically-shaped substrate supporting member 2. As an alternative form, as shown in FIG. 2, the cylindrical lateral wall portion 9 may be formed like a reversed funnel shape that is becoming diametrically enlarged as it extends vertically from the peripheral edge of the disc-shaped substrate supporting portion 8*e* toward the bottom side (bottom side in FIG. 1) along the outer periphery of the cylindrically-shaped substrate supporting member 2.

It should be noted, however, that in order to ensure that the temperature difference that may occur between the substrate supporting member 2 and substrate supporting/transferring tray 8 when the substrate supporting/transferring tray 8 is heated through the substrate supporting member 2 by the heating means 4 or the temperature distribution inside the surface of the substrate supporting/transferring tray 8 can be kept as small as possible, thereby allowing the substrate supporting/transferring tray 8 to be heated uniformly inside its surface, the cylindrical lateral wall portion 9 should preferably be formed like the cylindrical shape such that it can extend from the peripheral edge of the disc-shaped substrate supporting portion 8*e* along the outer periphery of the substrate supporting member 8, as shown in FIG. 1.

An annular portion 10 is provided such that it extends radially outwardly from the bottom side of the cylindrical lateral wall portion 9.

The substrate supporting/transferring tray 8 in which the substrate 1 is placed on the disc-shaped substrate supporting portion 8*e* as shown in FIG. 1 may be lifted by operating a transfer robot or the like, which includes a pair of arms 23, 24 at its forward end and a pair of forks 21a, 21b bifurcated from its base end 22 linked to the pair of arms 23, 24. Then, the substrate supporting/transferring tray 8 may be transferred by operating the transfer robot to cause its pair of forks 21a, 21b to support the bottom side of the annular portion 10.

When the heating process is then completed for one substrate 1, the substrate supporting/transferring tray 8 on which that substrate 1 is placed may be removed from the substrate supporting member 2 by operating the transfer robot to cause its pair of forks 21a, 21b to support the underside of the annular portion 10 of the substrate supporting/transferring tray 8, without having to wait for the temperature of the substrate 1 to be lowered. Another substrate supporting/transferring tray 8 that follows the preceding substrate supporting/transferring tray 8 and having another substrate 1 placed on the disc-shaped substrate supporting portion 8e may be transferred onto the substrate supporting member 2 in the treatment chamber 11 where the heating process may begin for the new substrate 1. In this way, the heating process can occur efficiently for more than one substrate in sequence.

Figure 7A:
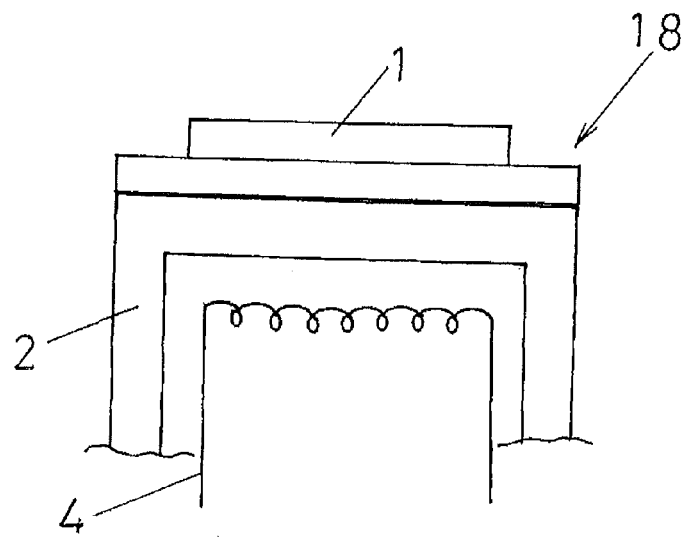
FIGS. 7 (*a*) and (*b*) represent a cross-sectional view illustrating the substrate supporting/transferring tray according to the prior art, although some parts are not shown.
Figure 7B:
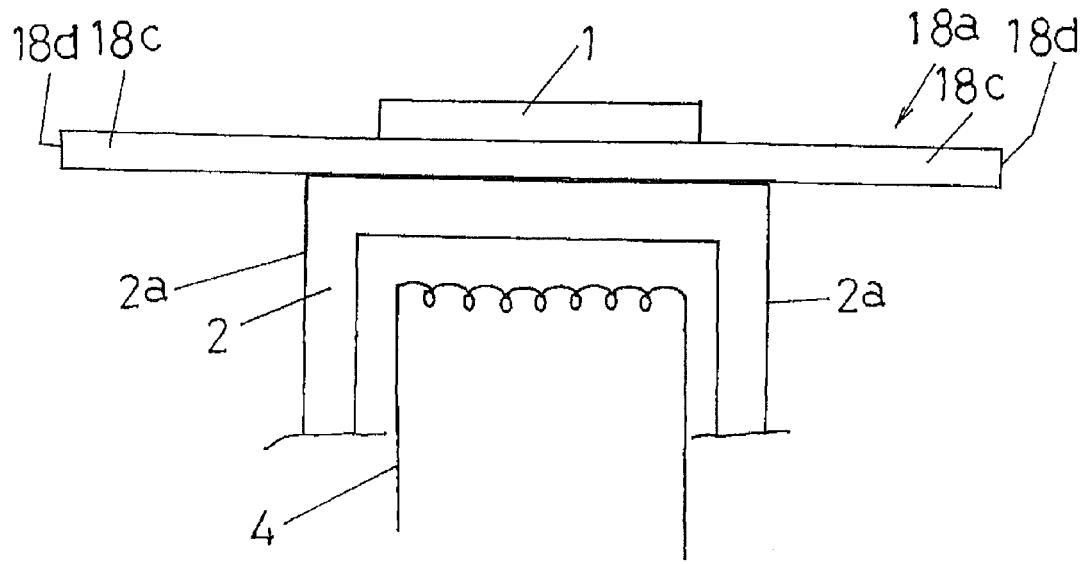

It may be seen from FIGS. 1 and 2 that the substrate supporting/transferring tray 8 includes the cylindrical lateral wall portion 9 extending from the peripheral edge of the disc-shaped substrate supporting portion 8e provided on its upper side toward the bottom side. Thus, the temperature difference that may occur between the substrate supporting member 2 and substrate supporting/transferring tray 8 when the substrate supporting/transferring tray is heated through the substrate supporting member 2 by the heating means 4 can be kept as small as possible, as compared against the prior art substrate supporting/transferring tray 18, 18a having the form shown in FIG. 7 (a), (b), respectively. The temperature distribution inside the surface of the substrate supporting/transferring tray 8 may also be kept as small as possible, as compared against the prior art substrate supporting/transferring tray 18, 18a having the form shown in FIG. 7 (a), (b), respectively. For the substrate supporting/transferring tray 8 of the present invention, therefore, the heating can occur more uniformly inside the surface.

Figure 4:
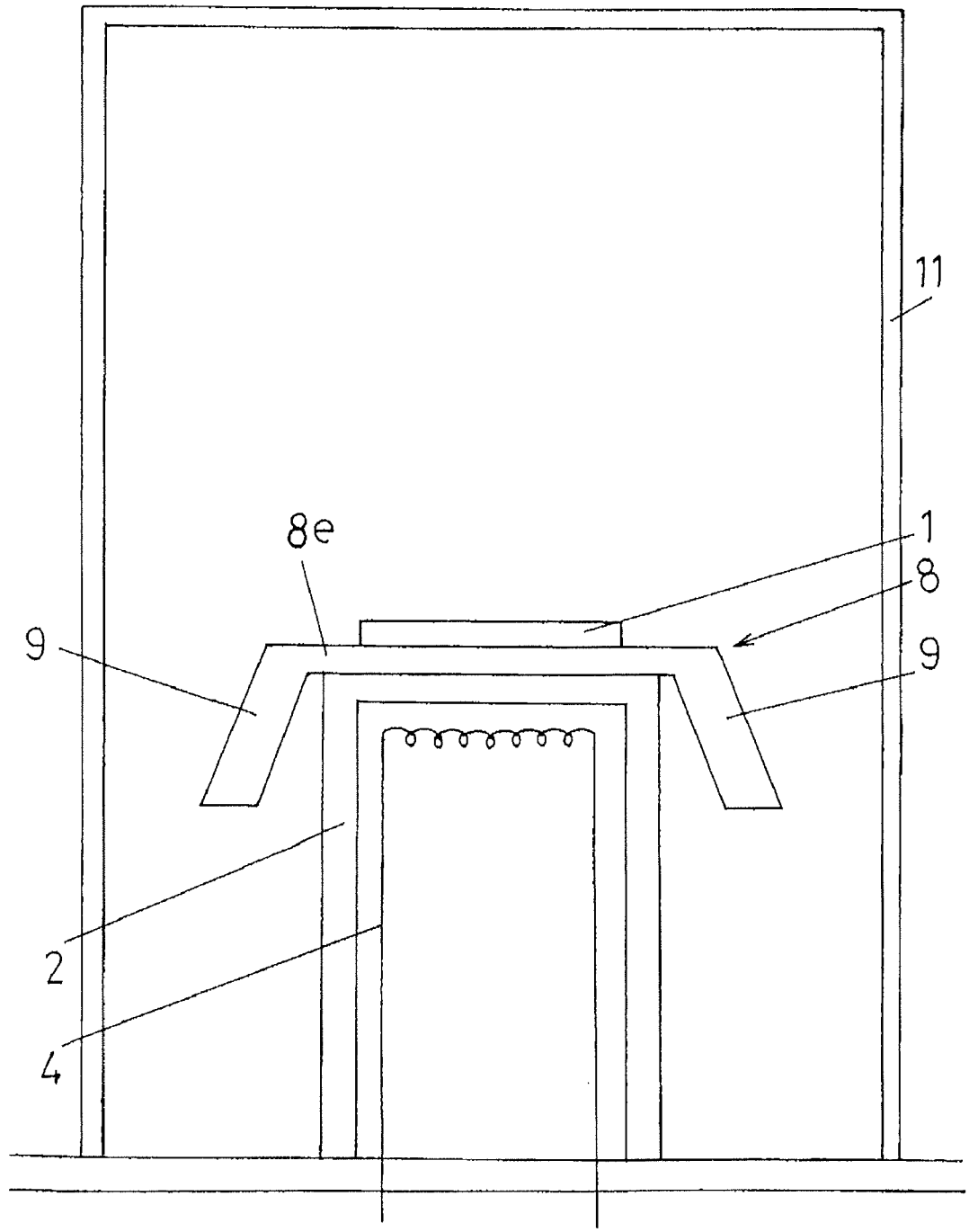
FIG. 4 represents a cross-sectional view illustrating the substrate supporting/transferring tray according to a variation of the second embodiment of the present invention shown in FIG. 2, although some parts are not shown.

In the embodiments shown in FIGS. 3 and 4, the annular portion 10 is not provided, but only the cylindrical lateral wall portion 9 is provided. However, this embodiment may also provide the effects that are equivalent to those of the embodiments described above. Specifically, the embodiment shown in FIG. 3 represents a variation of the embodiment shown in FIG. 1 in which no annular portion 10 is provided, but only the cylindrical lateral wall portion 9 is provided. Similarly, the embodiment shown in FIG. 4 represents a variation of the embodiment shown in FIG. 2 in which no annular portion 10 is provided, but only the cylindrical lateral wall portion 9 is provided. The embodiments shown in FIGS. 3 and 4 would be more advantageous if the annular portion 10 is also provided as is the case for the embodiments shown in FIGS. 1 and 2, since the temperature difference that may occur between the substrate supporting member 2 having the heating means 4 incorporated therein and the substrate supporting/transferring tray 8 can be reduced further and the temperature distribution inside the substrate supporting/transferring tray 8 can also be reduced further, thereby permitting the heating process to occur more uniformly inside the substrate supporting/transferring tray 8.

Figure 5A:
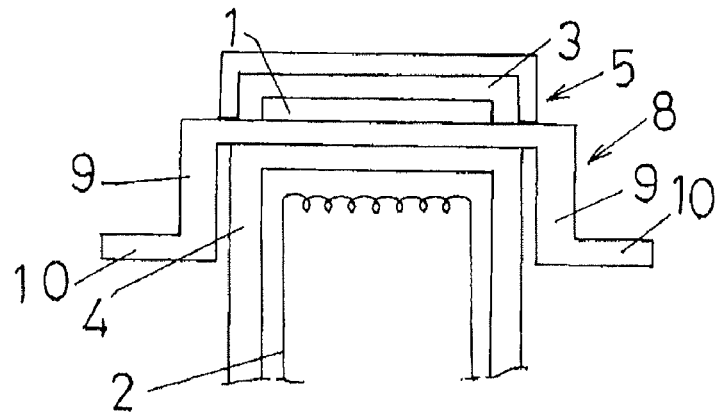
FIGS. 5 (*a*), (*b*) and (*c*) represent a cross-sectional view illustrating the substrate supporting/transferring tray according to a third embodiment of the present invention, although some parts are not shown.
Figure 5B:
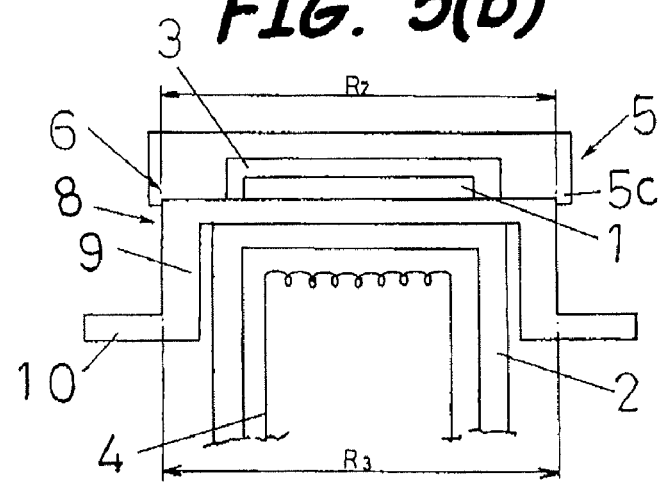
Figure 5C:
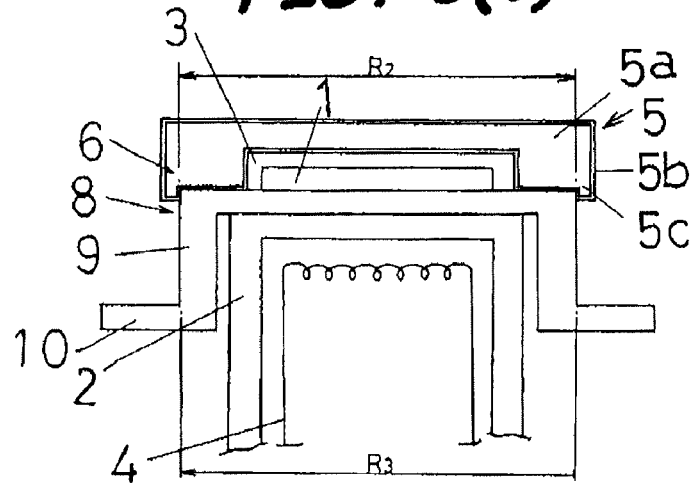
Figure 6A:
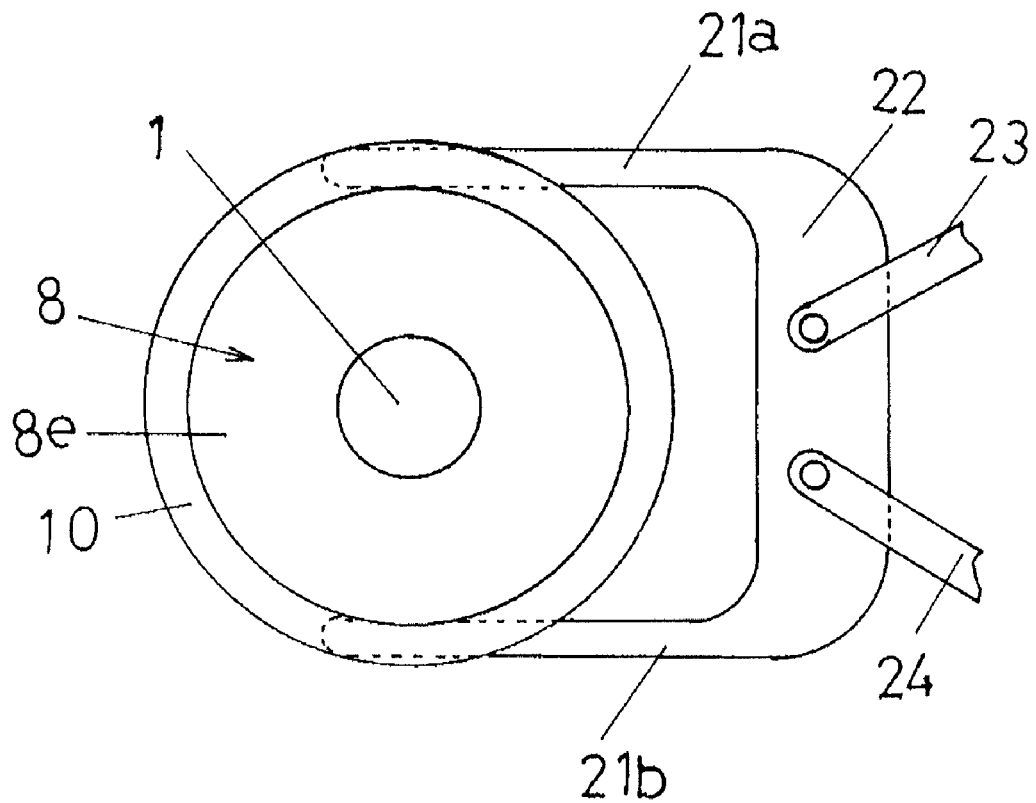
FIG. 6 (*a*) represents a plan view illustrating how the substrate supporting/transferring tray having a substrate placed thereon can be operated in accordance with an embodiment of the present invention.
Figure 6B:
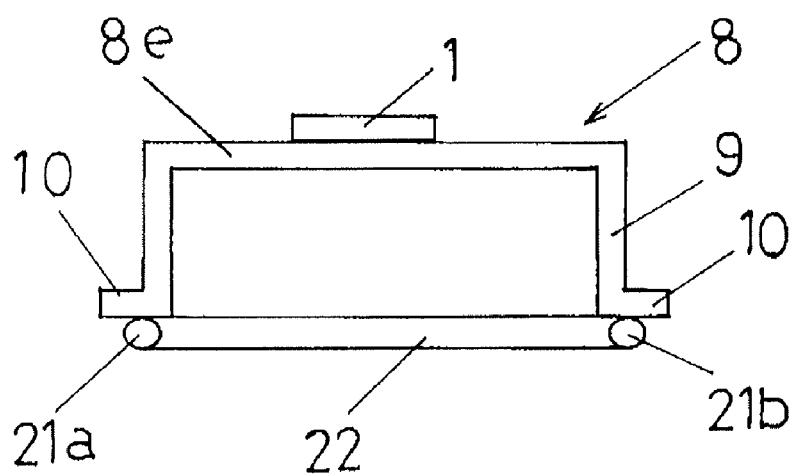

As shown in FIG. 5 (a), a cap 5 is mounted on the substrate supporting/transferring tray 8. This cap 5 may be provided for covering the substrate 1 (such as SiC substrate) placed on the substrate supporting/transferring tray 8, so that it can cooperate with the substrate supporting/transferring tray 8 to seal the substrate 1 during the heating process.

Specifically, the cap 5 may be provided for sealing the space 3 in which the substrate 1 is placed during the heating process. More specifically, the substrate supporting/transferring tray 8 on which the substrate 1 is placed may be covered with the cap 5, thereby sealing the space 3 in which the substrate 1 is placed during the heating process.

In this way, the substrate 1 can be heated more efficiently because the space 3 in which the substrate 1 is placed can be sealed by the cap 5 as described above during the heating process and because of the radiant heat originating from the cap 5.

The embodiment shown in FIG. 5 (b) differs from the embodiment shown in FIG. 5 (a) in that the cap 5 has a hook step 6 on the bottom side of the lateral wall 5c that is provided for engaging the outer periphery on the upper end of the substrate supporting/transferring tray 8, with the inner diameter R2 of the lateral wall of the cap 5 where the hook step 6 is located being larger than the outer diameter R3 of the cylindrical lateral wall portion 9 of the substrate supporting/transferring tray 8 by at least the plus or positive (+) tolerance.

Specifically, the substrate supporting/transferring tray 8 shown in FIG. 5 (b) is combined with the cap 5 that may be placed on the substrate supporting portion on which the substrate 1 is placed so that it can seal the space 3 in which the substrate 1 is placed on the substrate supporting portion, wherein the cap 5 has the hook step 6 on its bottom end side that may engage the outer periphery on the upper end of the substrate supporting portion, with the inner diameter R2 of the lateral wall of the cap 5 where the hook step 6 is located being larger than the outer diameter R3 of the cylindrical lateral wall portion 9 of the substrate supporting/transferring tray 8 by at least the plus or positive (+) tolerance.

Thus, the space 3 in which the substrate 1 is placed can be sealed more securely by allowing the cap 5 and substrate supporting/transferring tray 8 to expand thermally during the heating process.

The embodiment shown in FIG. 5 (c) differs from the embodiment shown in FIG. 5 (b) in that the cap 5 has a coating layer 5b formed on the surface of the cap body 5a.

The coating layer 5b formed on the surface of the cap body 5a serves to prevent gases from being emitted from the cap 5 or prevent materials from scattering from the cap 5, thereby protecting the internal surface of the heat chamber 11 from being polluted with such gases or materials.

The coating layer 5b may be formed from any suitable materials that can prevent gases from being emitted from the cap body 5a, for example, pyrolytic carbons such as Pyrolytic Graphite, Pyrolytic Carbon and the like. The coating layer 5b should preferably be formed to have the thickness of between 10 μm and 50 μm.

Although the present invention has been described with reference to several preferred embodiments thereof by referring to the accompanying drawings, it should be understood that the present invention is not restricted to those embodiments, which may be modified in numerous ways without departing from the spirit and scope of the present invention as defined in the appended claims.

What is claimed is:

1. A substrate supporting/transferring tray on which a semiconductor substrate may be placed and which is adapted to be placed on a substrate supporting member arranged in a treatment chamber in which the heat treatment occurs for the substrate, the substrate supporting/transferring tray including:

a substrate supporting portion formed in a disc-shape on an upper side of the substrate supporting/transferring tray;

a lateral wall portion extending downwardly from a peripheral edge of the disc-shape substrate supporting portion; and an annular portion extending radially outwardly from the lateral wall portion, wherein a region surrounded by the lateral wall portion is space, and the annular portion exists at a position opposite to a surface for supporting a substrate of the substrate supporting portion and away from the surface.

2. The substrate supporting/transferring tray according to claim 1, wherein an outer peripheral edge of the substrate supporting portion is larger than that of the substrate supporting member.

3. A substrate supporting/transferring tray on which a semiconductor substrate may be placed and which is adapted to be placed on a substrate supporting member arranged in a treatment chamber in which the heat treatment occurs for the substrate, the substrate supporting/transferring tray including:

a substrate supporting portion formed in a disc-shape on an upper side of the substrate supporting/transferring tray; and a lateral wall portion extending downwardly from a peripheral edge of the disc-shape substrate supporting portion, wherein an outer peripheral edge of the substrate supporting portion is larger than that of the substrate supporting member, and a region surrounded by the lateral wall portion is space.

4. Apparatus for heat-treating a substrate, comprising:
a treatment chamber;

a supporting member disposed inside the treatment chamber, comprising a ceiling wall and side wall which constitute an inner space, provided with heating means in the inner space; and a substrate tray removably attached to the supporting member and comprising a top portion extending over the ceiling wall of the supporting member and thermally coupled to an outer surface of the ceiling wall of the supporting member and a side portion extending downward and along the side wall of the supporting member and thermally coupled to the outer surface of the sidewall of the supporting member, the side portion being thermally connected to the top portion and the peripheral edge of the side portion being configured to be mechanically supported by a fork of a transfer robot.

5. The apparatus according to claim 4, wherein the heating means generates electrons which are bombarded onto inner surfaces of the ceiling wall and the side wall of the supporting member to heat the supporting member.

6. The apparatus according to claim 4, wherein a peripheral edge of the side portion is provided with an annular portion extending radically outward.

7. The apparatus according to claim 4, further comprising a cap amounted on the substrate tray, the outer peripheral of the cap being provided with a hook step inserted into the outer surface of the side portion of the substrate tray.

* * * * *